United States Patent
Farkas et al.

(10) Patent No.: US 10,925,153 B2
(45) Date of Patent: Feb. 16, 2021

(54) SYSTEM AND METHOD TO PROVIDE CONNECTION PADS FOR HIGH SPEED CABLES

(71) Applicant: DELL PRODUCTS, LP, Round Rock, TX (US)

(72) Inventors: Sandor Farkas, Round Rock, TX (US); Bhyrav M. Mutnury, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/385,569

(22) Filed: Apr. 16, 2019

(65) Prior Publication Data

US 2020/0337149 A1 Oct. 22, 2020

(51) Int. Cl.
| | |
|---|---|
| H05K 7/10 | (2006.01) |
| H05K 7/12 | (2006.01) |
| H05K 1/02 | (2006.01) |
| H05K 1/11 | (2006.01) |
| H05K 3/30 | (2006.01) |
| H05K 3/40 | (2006.01) |

(52) U.S. Cl.
CPC .......... *H05K 1/0243* (2013.01); *H05K 1/112* (2013.01); *H05K 3/303* (2013.01); *H05K 3/4007* (2013.01); *H05K 2201/09236* (2013.01); *H05K 2201/10356* (2013.01)

(58) Field of Classification Search
USPC ........................................................ 361/767
See application file for complete search history.

(56) References Cited

U.S. PATENT DOCUMENTS

| | | | |
|---|---|---|---|
| 7,548,994 B2 | 6/2009 | Ali et al. | |
| 7,804,680 B2 | 9/2010 | Mundt et al. | |
| 8,694,709 B2 | 4/2014 | Loffink | |
| 2013/0009179 A1* | 1/2013 | Bhat | H05K 1/0209 257/89 |
| 2013/0056254 A1* | 3/2013 | Biddle | H05K 1/0245 174/263 |
| 2013/0125634 A1* | 5/2013 | Nzeadibe | G01L 23/145 73/114.18 |
| 2015/0160760 A1* | 6/2015 | Sato | G06F 1/1643 345/174 |
| 2015/0186281 A1 | 7/2015 | Cherian et al. | |
| 2015/0195906 A1* | 7/2015 | Chang | H05K 1/115 361/767 |
| 2018/0032390 A1 | 2/2018 | Rahmanian et al. | |
| 2018/0294076 A1 | 10/2018 | Farkas et al. | |
| 2018/0356994 A1 | 12/2018 | Berke et al. | |

* cited by examiner

*Primary Examiner* — Andargie M Aychillhum
(74) *Attorney, Agent, or Firm* — Larson Newman, LLP

(57) ABSTRACT

A printed circuit board includes first and second signal pads, and first, second, and third ground pads. The first and second signal pads and the first and second ground pads are arranged in a line with the first and second signal pads between the first and second ground pads. The third ground pad is arranged between the first and second signal pads but is not in line with the first and second signal pads.

18 Claims, 5 Drawing Sheets

210

220

IA

410

IIA

410

IIIA

460

IB

410

IIB

410

IIIB

460

500

SYSTEM AND METHOD TO PROVIDE CONNECTION PADS FOR HIGH SPEED CABLES

FIELD OF THE DISCLOSURE

This disclosure generally relates to information handling systems, and more particularly relates to providing connection pads on printed circuit boards for high speed cables.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include first and second signal pads, and first, second, and third ground pads. The first and second signal pads and the first and second ground pads may be arranged in a line with the first and second signal pads between the first and second ground pads. The third ground pad may be arranged between the first and second signal pads but is not in line with the first and second signal pads.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
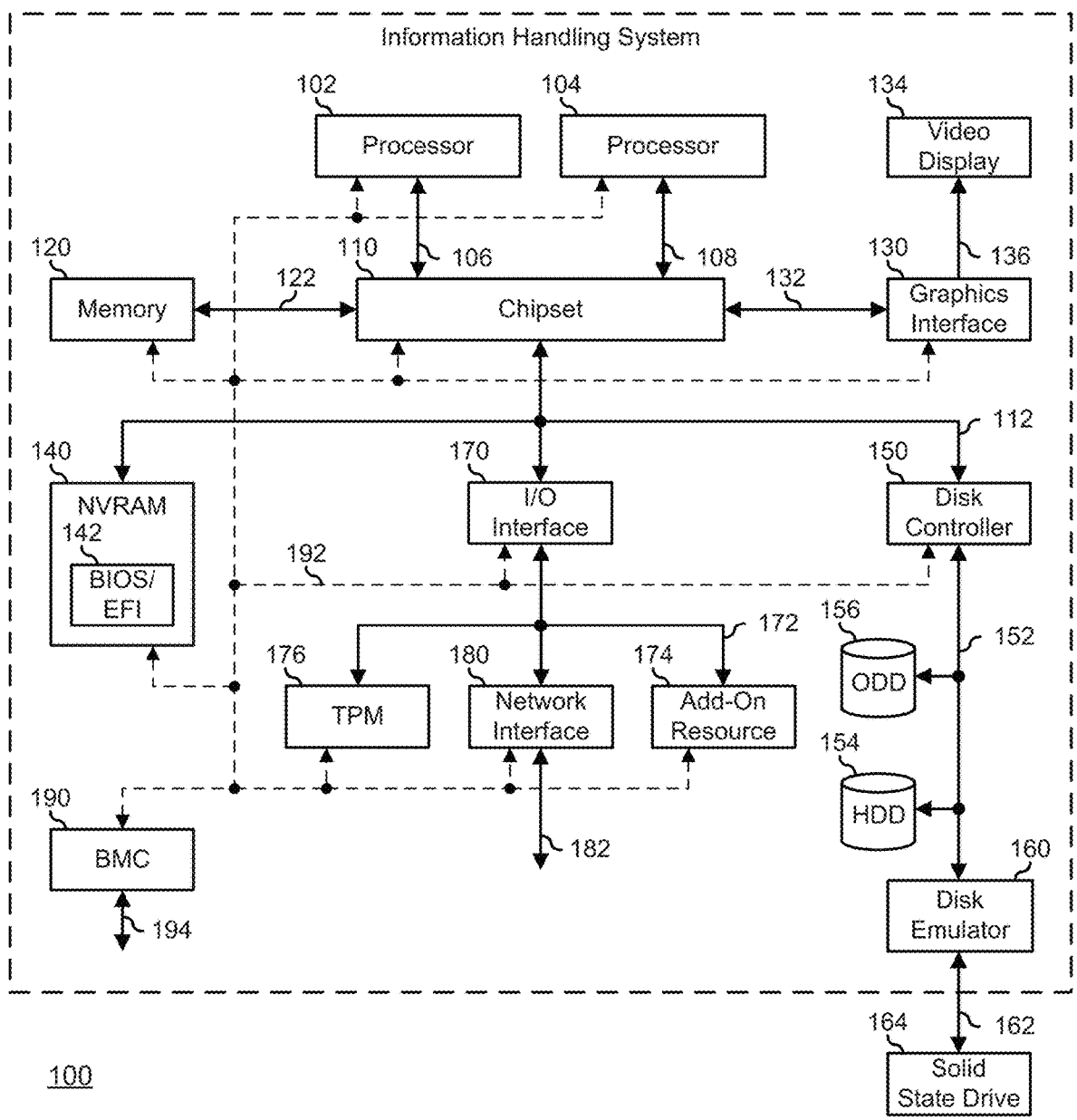
FIG. 1 is a block diagram of an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid state drive (SSD) 164, an input/output (I/O) interface 170 connected to an add-on resource 174 and a trusted platform module (TPM 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manages the data flows between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a Peripheral Component Interconnect-Express (PCIe) interface and graphics adapter 130 can include a four lane (x4) PCIe adapter, an eight lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to HDD 154, to ODD 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface 180 translates information from a format suitable to the peripheral channel to a format suitable to external devices. In a particular embodiment, network interface 180 includes a network interface card (NIC) or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof.

Network channel 182 can be connected to an external network resource (not illustrated). The network resource can include another information handling system, a data storage system, another network, a grid management system, another suitable resource, or a combination thereof. BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like.

The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 180 can vary considerably based on the type of information handling system. BMC 190 can operate in accordance with an Intelligent Platform Management Interface (IPMI). Examples of BMC 190 include an Integrated Dell Remote Access Controller (iDRAC). Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like.

As used herein, out-of-band access refers to operations performed apart from a BIOS/operating system execution environment on information handling system 100, that is apart from the execution of code by processors 102 and 104 and procedures that are implemented on the information handling system in response to the executed code. BMC 190 operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WS-MAN) interface, a Management Component Transport Protocol (MCTP) or a Redfish interface, various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated onto another element of the information handling system such as chipset 110, or another suitable element, as needed or desired. As such, BMC 190 can be part of an integrated circuit or a chip set within information handling system 100. An example of BMC 190 includes an integrated Dell remote access controller (iDRAC), or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Historically, signals were routed between the elements of an information handling system via circuit traces on a motherboard or other printed circuit board (PCB) of the information handling system. However, as the speed of the signals carried by the circuit traces, and the complexity in routing the circuit traces have increased, cables have come into more common use for routing high speed signals in an information handling system. Cables for high speed signal routing may typically be seen replacing circuit traces for PCIe links, Inter-chip Global Memory Interconnect (xGMI) links, Non-Volatie Memory-Express (NVMe) interfaces, and the like. Cables are seen as providing advantages over circuit traces on a PCB, including offering a lower loss medium for signal propagation, and a lower cost (a cable may be from 8-15 times cheaper than circuit traces on a PCB, depending on the choice of PCB material).

Figure 2:
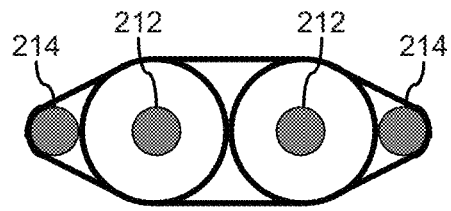
FIG. 2 is an illustration of cables for high speed signal routing as are known in the art.
Figure 2:
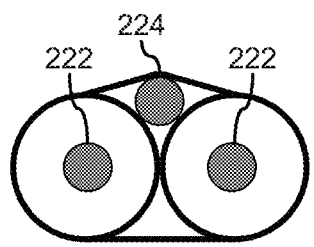

FIG. 2 illustrates two common varieties of cables for high speed signal routing; a dual-drain cable 210, and a single-drain cable 220. Dual-drain cable 210 includes a pair of signal conductors 212 and a pair of drain conductors 214. Signal conductors 212 and drain conductors 214 are arranged in a line with the signal conductors between the drain conductors. Connector pads on a PCB are typically laid out to accommodate dual-drain cable 210, where, signal conductors 212 are each soldered to an associated signal pad on the PCB, where drain conductors 214 are each soldered to an associated ground pad on the PCB, and where the signal pads and the ground pads are arranged in a line with the signal conductors between the drain conductors. This arrangement not only eases assembly with dual-drain cables, but also provides for the symmetric placement of ground vias for improved immunity from signal pad crosstalk.

Single-drain cable 220 includes a pair of signal conductors 222 and a single drain conductor 224. Signal conductors 222 and drain conductor 224 are arranged with the drain conductor between and to one side of the signal conductors in a triangular arrangement. Attaching single-drain cable 220 to a PCB with the pad arrangement for dual-drain cables presents challenges, as described below.

Figure 3:
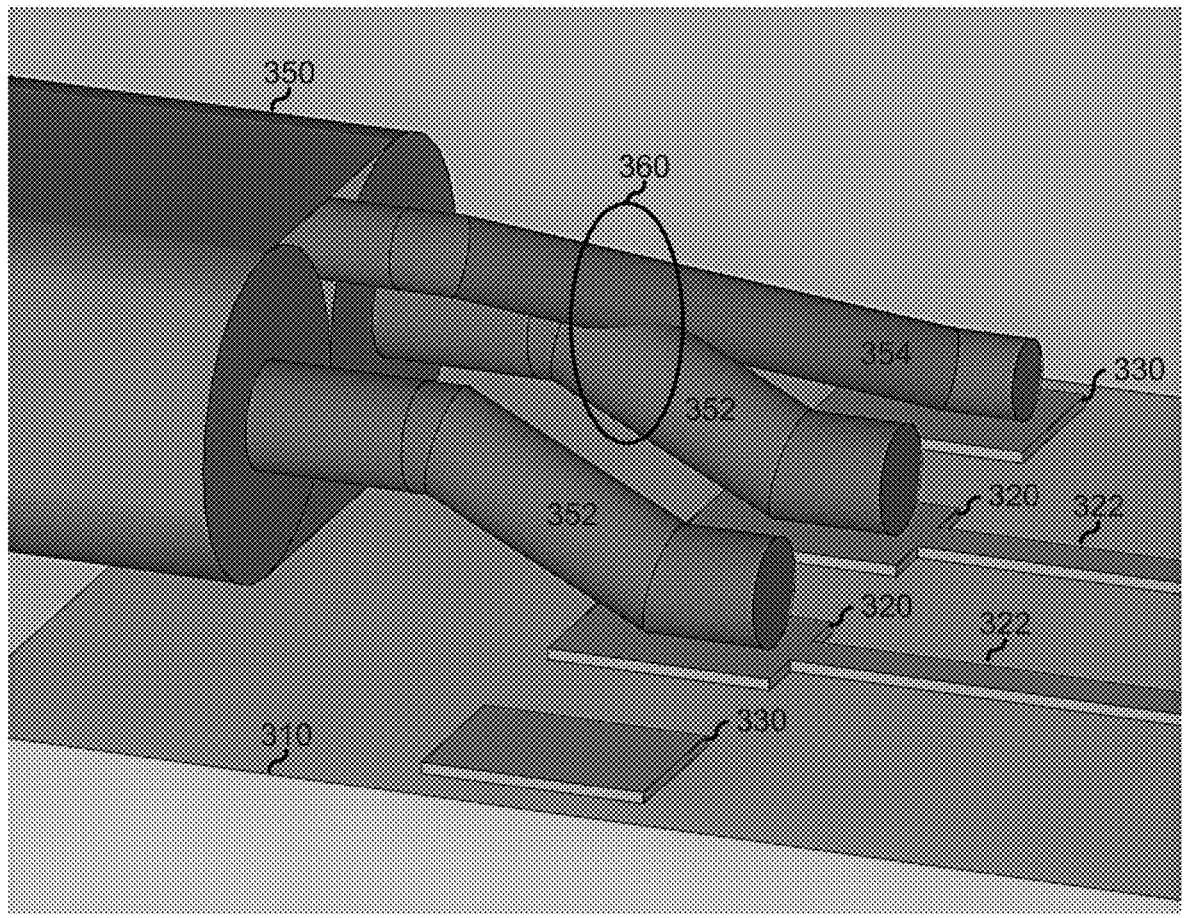
FIG. 3 is an illustration of a cable attachment scheme as is known in the art.

FIG. 3 illustrates a cable attachment scheme 300 where a single-drain cable 350 is connected to a PCB 310. PCB 310 includes two (2) signal pads 320 that are connected to signal traces 322 that route the signals from cable 350 to elements of the information handling system as needed or desired. PCB 310 also includes two (2) ground pads 330. Signal pads 320 and ground pads 330 are arranged in a line, with the signal pads between the ground pads. It will be recognized that a dual-drain cable will connect neatly to PCB 310 as the conductors in a dual-drain cable are arranged similarly to the arrangement of signal pads 320 and ground pads 330 on PCB 310. Single-drain cable 350 includes a pair of signal conductors 352 and a drain conductor 354. Cable 350 is attached to PCB 310 such that signal conductors 352 are each physically connected to an associated signal pad 320, and such that drain conductor 354 is crossed over one of the signal conductors and is physically connected to one of ground pads 330.

Attachment scheme 300 has the advantage over the use of dual-drain cables in that single-drain cables typically cost less than dual-drain cables, and ribbon cables made up of pairs of single-drain cables are narrower than ribbon cables made up of pairs of dual-drain cables, thus making for more compact connections between devices of an information handling system, among other advantages. However, attachment scheme 300 suffers from several drawbacks. The mechanical stresses on drain conductor 354 is greater than on signal conductors 352, leading to increased cracking and breaking of the drain conductor, especially where cable 350 is a flexible cable to accommodate where PCB 310 or another element of the information handling system is intended to be movable, such as where the PCB is part of a slide out sled that includes various hot-swappable elements of the information handling system. further, as shown by highlight 360, drain conductor 354 is subject to shorting with signal conductor 352.

Figure 4:
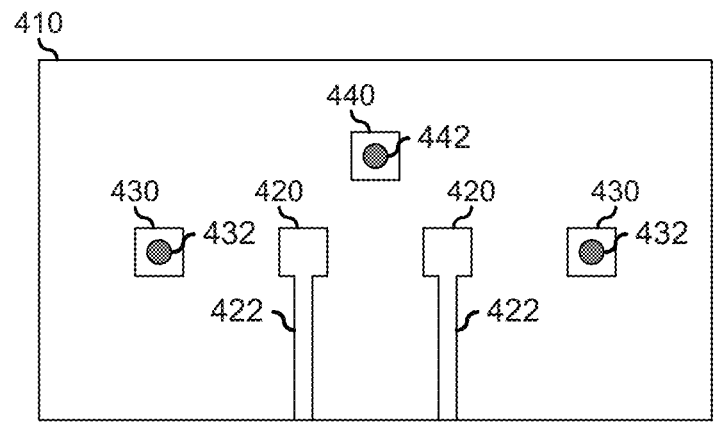
FIG. 4 is an illustration of connection pad layouts on printed circuit boards according to an embodiment of the present disclosure.
Figure 4:
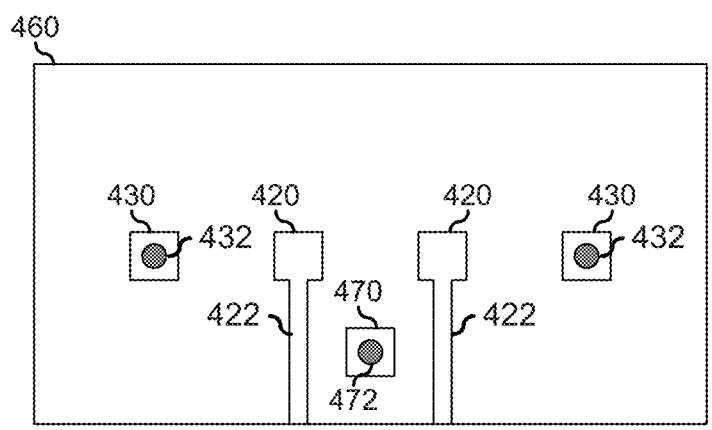

FIG. 4 illustrates a connection pad layout 400 for attaching a high speed cables to a PCB 410. Connection layout 400 includes signal pads 420 and ground pads 430. Signal pads 420 are connected to signal traces 422 that route the signals from a cable to elements of the information handling system as needed or desired. Ground pads 430 are connected to one or more ground plane of PCB 410 by through-hole vias 432. Signal pads 420 and ground pads 430 are arranged in a line, with the signal pads between the ground pads, similarly to PCB 310. Layout 400 is thus configured to easily accommodate dual-drain cables where the signal conductors are each soldered to one of associated signal pad 420, and where the drain conductors are each soldered to associated ground pad 430. Layout 400 also includes a ground pad 440 that is connected to one or more ground plane of PCB 410 by a through-hole via 442. Ground pad 440 is arranged on PCB 410 at a location between signal pads 420, and above the line formed by the signal pads and ground pads 430, that is, on a side of the line that is closer to the end of the incoming cable. Layout 400 is thus also configured to easily accommodate single-drain cables where the signal conductors are each soldered to one of associated signal pad 420, and where the drain conductor is soldered to ground pad 440.

Figure 5:
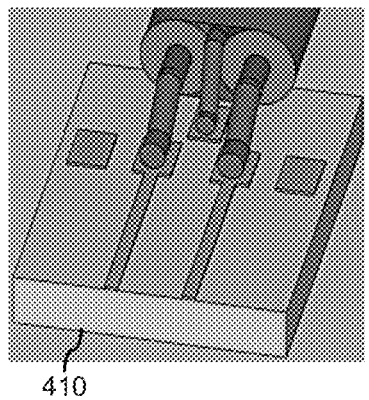
FIG. 5 is an illustration of cable attachment schemes using the connection pad layouts of FIG. 4.
Figure 5:
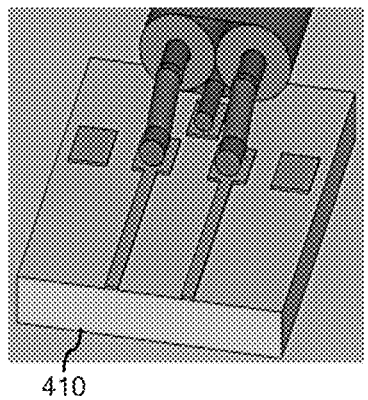
Figure 5:
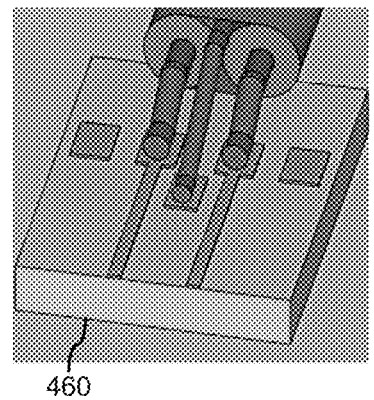
Figure 5:
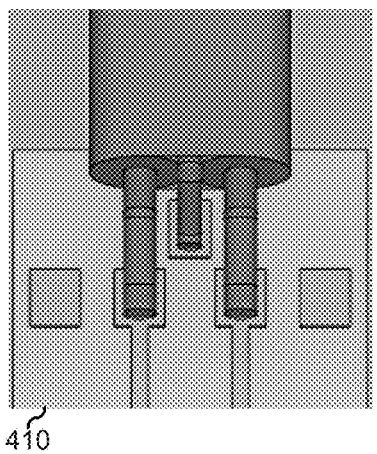
Figure 5:
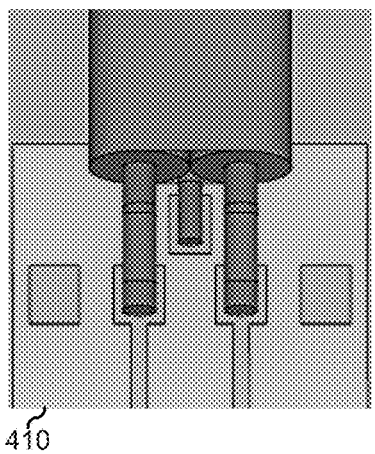
Figure 5:
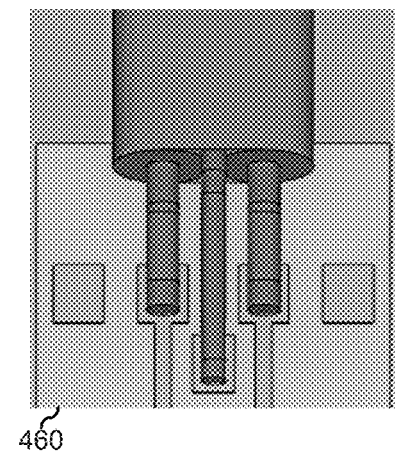

FIG. 5 illustrates various attachment schemes in accordance with the present embodiments. Image pairs I and II illustrate attachment schemes utilizing PCB 410. Image pair I shows a single-drain cable attached to PCB 410, where the drain conductor is situated at a top side of the cable, that is, a side of the cable furthest from the PCB. Image IA shows an oblique view and image IB shows a top view. Image pair II shows a single-drain cable attached to PCB 410, where the drain conductor is situated at a bottom side of the cable, that is, a side of the cable closest to the PCB. Image IIA shows an oblique view and image IIB shows a top view. Note that image pair II shows an orientation of the cable, with the drain conductor oat the bottom side of the cable, that could not be accommodated by the conventional pad layout as shown in FIG. 3, because the drain conductor would have a high probability of shorting to the particular signal conductor in being routed underneath the signal conductor to be connected to one of ground conductors 330.

Returning to FIG. 4, a connection pad layout 450 for attaching a high speed cables to a PCB 460 is illustrated. Connection layout 450 includes signal pads 470 and ground pads 480. Signal pads 470 are connected to signal traces 472 that route the signals from a cable to elements of the information handling system as needed or desired. Ground pads 480 are connected to one or more ground plane of PCB 460 by through-hole vias 482. Signal pads 470 and ground pads 480 are arranged in a line, with the signal pads between the ground pads, similarly to PCB 410, and layout 450 is thus configured to easily accommodate dual-drain cables. Layout 450 also includes a ground pad 490 that is connected to one or more ground plane of PCB 450 by a through-hole via 492. Ground pad 490 is arranged on PCB 450 at a location between signal pads 470, and below the line formed by the signal pads and ground pads 480, that is, on a side of the line that is farther from the end of the incoming cable. Layout 450 is thus also configured to easily accommodate single-drain cables where the signal conductors are each soldered to one of associated signal pad 470, and where the drain conductor is soldered to ground pad 490.

Returning to FIG. 5, image pair III illustrates an attachment scheme utilizing PCB 460. Image pair III shows a single-drain cable attached to PCB 460, where the drain conductor is situated at a top side of the cable, that is, a side of the cable furthest from the PCB. Image IA shows an oblique view and image IB shows a top view.

For purpose of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board, comprising:
   first and second signal wire bond pads; and
   first, second, and third ground wire bond pads, wherein the first and second signal wire bond pads and the first and second ground wire bond pads are arranged in a line with the first and second signal wire bond pads between the first and second ground wire bond pads, and wherein the third ground wire bond pad is arranged between the first and second signal wire bond pads but is not in line with the first and second signal wire bond pads, wherein the printed circuit board is arranged to couple a single-drain cable such that a first signal conductor of the single-drain cable is connected to the first signal wire bond pad, a second signal conductor of the single-drain cable is connected to the second signal wire bond pad, and a ground conductor of the single-drain cable is connected to the third ground wire bond pad.

2. The printed circuit board of claim 1, further comprising:
   first and second signal traces, the first signal trace to couple the first signal wire bond pad to a first signal input of a device mounted to the printed circuit board, and the second signal trace to couple the second wire bond pad to a second input of the device.

3. The printed circuit board of claim 1, further comprising:
   first, second, and third ground vias, the first ground via to couple the first ground wire bond pad to a ground plane of the printed circuit board, the second ground via to couple the second ground wire bond pad to the ground plane, and the third ground via to couple the third ground wire bond pad to the ground plane.

4. The printed circuit board of claim 1, wherein the third ground wire bond pad is arranged on a side of the line that is adjacent to the single-drain cable.

5. The printed circuit board of claim 4, wherein the single-drain cable is arranged with the ground conductor at a bottom of the single-drain cable with respect to a surface of the printed circuit board.

6. The printed circuit board of claim 4, wherein the single-drain cable is arranged with the ground conductor at a top of the single-drain cable with respect to a surface of the printed circuit board.

7. The printed circuit board of claim 1, wherein the third ground wire bond pad is arranged on a side of the line that is opposite of the single-drain cable.

8. The printed circuit board of claim 1, wherein the printed circuit board is arranged to couple a dual-drain cable such that a first signal conductor of the dual-drain cable is connected to the first signal wire bond pad, a second signal conductor of the dual-drain cable is connected to the second signal wire bond pad, a first ground conductor of the dual-drain cable is connected to the first ground wire bond pad, and a second ground conductor of the dual-drain cable is connected to the second ground wire bond pad.

9. A method, comprising:
   providing, on a printed circuit board, first and second signal wire bond pads;
   providing, on the printed circuit board, first, second, and third ground wire bond pads, wherein the first and second signal wire bond pads and the first and second ground wire bond pads are arranged in a line with the first and second signal wire bond pads between the first and second ground wire bond pads, and wherein the third ground wire bond pad is arranged between the first and second signal wire bond pads but is not in line with the first and second signal wire bond pads;
   coupling a single-drain cable to the printed circuit boards;
   coupling a first signal conductor of a dual-drain cable to the first signal wire bond pad;
   coupling a second signal conductor of the dual-drain cable to the second signal wire bond pad;
   coupling a first ground conductor of the dual-drain cable to the first ground wire bond pad; and
   coupling a second ground conductor of the dual-drain cable to the second ground wire bond pad.

10. The method of claim 9, further comprising:
    coupling a first signal wire bond pad to a first signal input of a device mounted to the printed circuit board via a first circuit trace; and
    coupling the second signal wire bond pad to a second signal input of the device via a second circuit trace.

11. The method of claim 9, further comprising:
    coupling the first ground wire bond pad to a ground plane of the printed circuit board by a first ground via;
    coupling the second ground wire bond pad to the ground plane by a second ground via; and
    coupling the third ground wire bond pad to the ground plane by a third ground via.

12. The method of claim 9, wherein in coupling the single-drain cable to the printed circuit board, the method further comprises:
    coupling a first signal conductor of the single-drain cable to the first signal wire bond pad;
    coupling a second signal conductor of the single-drain cable to the second signal wire bond pad; and
    coupling a ground conductor of the single-drain cable to the third ground wire bond pad.

13. The method of claim 12, wherein the third ground wire bond pad is arranged on a side of the line that is opposite of the single-drain cable.

14. The method of claim 12, wherein the third ground wire bond pad is arranged on a side of the line that is adjacent to the single-drain cable.

15. The method of claim 14, wherein the single-drain cable is arranged with the ground conductor at a bottom of the single-drain cable with respect to a surface of the printed circuit board.

16. The method of claim 14, wherein the single-drain cable is arranged with the ground conductor at a top of the single-drain cable with respect to a surface of the printed circuit board.

17. An information handling system, comprising:
    a printed circuit board including:
        first and second signal pads; and
        first, second, and third ground pads, wherein the first and second signal pads and the first and second ground pads are arranged in a line with the first and second signal pads between the first and second ground pads, and wherein the third ground pad is arranged between the first and second signal pads but is not in line with the first and second signal pads; and a single-drain cable to couple the printed circuit board to a device, the single-drain cable including:
- a first signal conductor coupled to the first signal pad;
- a second signal conductor coupled to the second signal pad; and
- a ground conductor coupled to the third ground pad.

18. The information handling system of claim 17, where the printed circuit board further includes first, second, and third ground vias, the first ground via to couple the first ground pad to a ground plane of the printed circuit board, the second ground via to couple the second ground pad to the ground plane, and the third ground via to couple the third ground pad to the ground plane.

\* \* \* \* \*